(12) United States Patent
Neal et al.

(10) Patent No.: US 8,350,180 B2
(45) Date of Patent: Jan. 8, 2013

(54) HIGH PRESSURE PRE-OXIDATION FOR DEPOSITION OF THERMAL BARRIER COATING WITH HOOD

(75) Inventors: James W. Neal, Ellington, CT (US); Kevin W. Schlichting, South Glastonbury, CT (US); Peter F. Gero, Portland, CT (US)

(73) Assignee: United Technologies Corporation, Hartford, CT (US)

( * ) Notice: Subject to any disclaimer, the term of this patent is extended or adjusted under 35 U.S.C. 154(b) by 397 days.

(21) Appl. No.: 12/723,420

(22) Filed: Mar. 12, 2010

(65) Prior Publication Data

US 2011/0223353 A1 Sep. 15, 2011

(51) Int. Cl.
*B23K 9/00* (2006.01)
*B23K 11/16* (2006.01)

(52) U.S. Cl. ........ 219/118; 219/634; 427/557; 427/566; 427/596

(58) Field of Classification Search .................. 219/118, 219/618, 634, 635, 724; 427/566, 557, 596
See application file for complete search history.

(56) References Cited

U.S. PATENT DOCUMENTS

| | | | |
|---|---|---|---|
| 4,481,237 A | 11/1984 | Bosshart et al. |
| 5,087,477 A | 2/1992 | Giggins, Jr. et al. |
| 5,268,061 A | 12/1993 | Sunwoo et al. |
| 5,418,003 A | 5/1995 | Bruce et al. |
| 5,601,652 A | 2/1997 | Mullin et al. |
| 5,773,078 A | 6/1998 | Skelly |
| 5,792,521 A | 8/1998 | Wortman |
| 5,942,334 A | 8/1999 | Wortman |
| 6,054,184 A | 4/2000 | Bruce et al. |
| 6,174,571 B1 | 1/2001 | Corderman et al. |
| 6,210,744 B1 | 4/2001 | Hayess et al. |
| 6,365,013 B1 | 4/2002 | Beele |
| 6,478,888 B1 | 11/2002 | Burns |
| 6,488,907 B1 | 12/2002 | Barnes et al. |
| 6,589,351 B1 | 7/2003 | Bruce et al. |
| 6,620,465 B2 | 9/2003 | Rigney et al. |
| 6,677,560 B2 | 1/2004 | Eberhardt et al. |

(Continued)

FOREIGN PATENT DOCUMENTS

| | | |
|---|---|---|
| EP | 1 593 752 A2 | 11/2005 |
| JP | 62111485 A | 5/1987 |
| JP | 09003624 A | 7/1997 |

OTHER PUBLICATIONS

Induction Atmospheres "Heating an Inconnel Susceptor for Jet Fan Blades in Argon," Applications Research Database (1 page) Retrieved Nov. 30, 2009.

(Continued)

*Primary Examiner* — David Nhu
(74) *Attorney, Agent, or Firm* — Kinney & Lange, P.A.

(57) ABSTRACT

An apparatus for coating a work piece includes a process chamber, a coating material supply apparatus located at least partially within the process chamber for delivering a coating material to the work piece, a pre-heater assembly adjoining the process chamber, and a support for holding the work piece. The pre-heater assembly includes a housing that opens to the process chamber, a thermal hood positioned within the housing and configured to reflect thermal energy for reflecting thermal energy toward the work piece. The support is movable to selectively move the work piece between a first position within the housing of the pre-heater assembly and a second position within the process chamber and outside the housing of the pre-heater assembly.

15 Claims, 2 Drawing Sheets

U.S. PATENT DOCUMENTS

| | | | |
|---|---|---|---|
| 6,689,995 B2 | 2/2004 | Eberhardt et al. | |
| 6,770,333 B2 | 8/2004 | Bruce et al. | |
| 6,849,299 B2 | 2/2005 | Corderman et al. | |
| 6,863,937 B2 * | 3/2005 | Bruce et al. | 427/566 |
| 6,946,034 B1 | 9/2005 | Bruce et al. | |
| 6,983,718 B1 | 1/2006 | Bruce et al. | |
| 7,128,950 B2 | 10/2006 | Bruce et al. | |
| 7,229,701 B2 | 6/2007 | Madhava et al. | |
| 7,501,145 B2 | 3/2009 | Selvamanickam et al. | |
| 7,601,224 B2 | 10/2009 | Foree | |
| 2003/0203127 A1 | 10/2003 | Bruce et al. | |
| 2004/0058155 A1 | 3/2004 | Windischmann | |
| 2004/0219289 A1 | 11/2004 | Lamotte et al. | |
| 2007/0141233 A1 | 6/2007 | Schlichting | |
| 2008/0166489 A1 | 7/2008 | Strock et al. | |
| 2008/0199709 A1 | 8/2008 | Ishiwata et al. | |

OTHER PUBLICATIONS

Karnitz et al., "ATS Materials/Manufacturing," U.S. Department of Energy-Oak Ridge, Oak Ridge, TN, 1997 (29 pages).

Krumdieck et al., "Conversion Efficiency of Alkoxide Precursor to Oxide Films Grown by an Ultrasonic-Assisted, Pulsed Liquid Injection, Metalorganic Chemical Vapor Deposition (Pulsed-CVD) Process," J. Am. Ceram. Soc., 82 (6) 1605-07, 1999.

Tzimas, "Failure of thermal barrier coating systems under cyclic thermomemchanical loading,"Acta Materialia, vol. 48, Issue 18, 2009 (abstract only).

Extended European Search Report from EP Application Serial No. 11250297.6, filed on Mar. 11, 2011.

* cited by examiner

US 8,350,180 B2

HIGH PRESSURE PRE-OXIDATION FOR DEPOSITION OF THERMAL BARRIER COATING WITH HOOD

BACKGROUND

The present invention relates to coating apparatuses and methods of applying coatings.

Coatings are utilized in a variety of settings to provide a variety of benefits. For example, modern gas turbine engines can include thermal barrier coatings (TBCs), environmental coatings, etc. to help promote efficient and reliable operation. Application of coatings can involve a variety of different application methods, such as electron beam physical vapor deposition (EB-PVD). When TBCs are applied to gas turbine engine components, such as blades and vanes, using EB-PVD, the components being coated are first preheated and oxidized and then moved to a process chamber for deposition of the coating material. During the pre-heating stage, the components to be coated are in a pressure-controlled environment and an oxygen-containing gas may be present.

A significant problem with known pre-heating apparatus for use with EB-PVD is the degradation of heating elements. Known pre-heating chambers rely on graphite-based materials to protect against heat loss and as a material from which heating elements themselves are constructed. Such graphite components are life-limited because oxygen present in the pre-heating apparatus reacts with the graphite causing gradual erosion and degradation of both thermal insulation properties and heating capability of the graphite components. Degradation of pre-heater components requires eventual replacement of those components, which is burdensome and causes undesired expense. An additional problem associated with graphite components is the risk for detrimental and undesirable transfer of carbon to the components being pre-heated for coating, through a series of chemical reactions involving $O_2$, $CO_2$, CO and C (graphite). The transfer of carbon to the components to be coated poses a risk of poor or undesired coating properties.

SUMMARY

An apparatus for coating a work piece according to the present invention includes a process chamber, a coating material supply apparatus located at least partially within the process chamber for delivering a coating material to the work piece, a pre-heater assembly adjoining the process chamber, and a support for holding the work piece. The pre-heater assembly includes a housing that opens to the process chamber, a thermal hood positioned within the housing and configured to reflect thermal energy for reflecting thermal energy toward the work piece. The support is movable to selectively move the work piece between a first position within the housing of the pre-heater assembly and a second position within the process chamber and outside the housing of the pre-heater assembly.

DETAILED DESCRIPTION

In general, the present invention provides an apparatus and method for pre-heating work pieces desired to be coated. One or more electron beams are directed at a susceptor comprising a ceramic material, which in turn radiates heat towards at least one work piece to heat that work piece. The susceptor is positioned in a pressure-controlled pre-heater enclosure along with the work piece. An oxygen-containing gas can be provided to the work piece to oxidize the work piece during pre-heating, while the ceramic-based susceptor is generally non-reactive with oxygen in the pre-heater environment to thereby reduce or prevent degradation of the susceptor due to the presence of oxygen. The present invention is suitable for pre-heating gas turbine engine components for the application thermal barrier coatings (TBCs), in addition to other uses.

Figure 1:
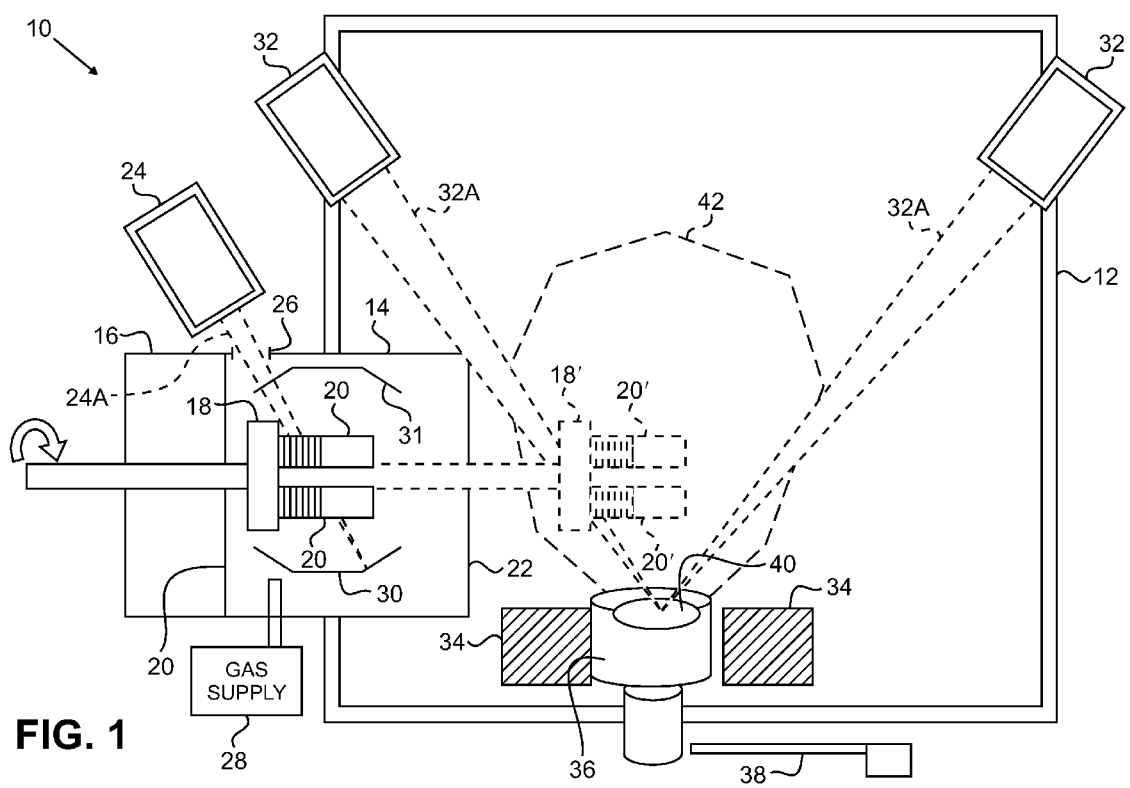
FIG. 1 is a schematic cross-sectional view of a coating system according to the present invention.

FIG. 1 is a schematic cross-sectional view of a coating system 10 that includes a process chamber 12, a pre-heating chamber 14, and a loading chamber 16. An axially movable and rotatable support 18 is provided for supporting one or more work pieces 20. An arrow in FIG. 1 illustrates one possible direction of rotation of the support 18, though in alternative embodiments rotation in another direction is possible. The work pieces 20 can be gas turbine engine components, such as blades or vanes, or other items in further embodiments.

The loading chamber 16 is located adjacent to the pre-heating chamber 14, separated by a gate valve 20. The work pieces 20 can be engaged to or disengaged from the support 18 in the loading chamber 16. The work pieces 20 can be moved into an out of the loading chamber 16 by axially moving the support 18 and opening and re-closing the gate valve 20.

The pre-heating chamber 14 is located adjacent to the process chamber 12. An enclosure (or housing) of the pre-heating chamber 14 can extend at least partially into the process chamber 12. A gate valve 22 separates interior environments of the process chamber 12. A differentially-pumped electron gun 24 is positioned at the pre-heating chamber 14 adjacent to an aerodynamic window 26 through a wall of the pre-heating chamber 14. The aerodynamic window 26 can be a valve-like structure that provides a physical passageway through the wall of the pre-heating chamber 14 while still helping to maintain desired pressure control within the pre-heating chamber 14. The electron gun 24 can be positioned outside the pre-heating chamber 14, and can generate an electron beam 24A directed into the pre-heating chamber 14 through the aerodynamic window 26. Locating the electron gun 24 outside of the process chamber 12 allows the gun 24 to be maintained at a different—and typically lower—operating pressure than that maintained inside the pre-heating chamber 14. A gas supply 28 is provided to direct oxygen or an oxygen-containing gas into the pre-heating chamber 14, which can be delivered at or near the work pieces 20 held by the support 18 when in a first position within the pre-heating chamber 14.

A susceptor 30 and a thermal hood 31 are positioned within the pre-heating chamber 14. In one embodiment, the susceptor 30 is made from an oxide-based ceramic material that is substantially inert and non-reactive with oxygen or other oxygen-containing gases delivered by the gas supply 28. The susceptor 30 is dish-shaped (i.e., with tipped or tilted edges) in the illustrated embodiment, though in alternative embodiments the susceptor can have any desired shape. A dish-like shape can help the susceptor 30 radiate heat to various portions of the work pieces 20 at an increased view factor. The susceptor 30 can be positioned adjacent to one side of the work pieces 20 when held by the support 18 in the first position within the pre-heating chamber 14. As will be explained later, the susceptor 30 can help provide heat to the work pieces 20 during pre-heating and pre-oxidation processes when the electron beam 24A is directed from the electron gun 24 at the susceptor 30. The thermal hood 31 is configured to reflect thermal energy back toward the work pieces 20, and can have a dish-like shape similar to the susceptor 30. It should be understood that like the susceptor 30, the thermal hood 31 can have other shapes in alternative embodiments. The thermal hood 31 can be made of a ceramic material similar or identical to that of the susceptor 30. Typically, the thermal hood 31 is positioned above the work pieces 20, such that rising heat that would otherwise be lost to the relatively cool walls of the pre-heating chamber 14 is instead reflected back to the work pieces 20 to help maintain the work pieces 20 at desired pre-heating and pre-oxidizing temperatures. In one embodiment, the thermal hood 31 is configured to provide reflective infrared shielding. In some embodiments, the thermal hood 31 can be moveable (using any suitable actuation mechanism) to further help regulate thermal conditions in the pre-heating chamber 14.

The process chamber 12 includes equipment for depositing a coating, that is, a coating material supply apparatus. In the illustrated embodiment, conventional electron beam physical vapor deposition (EB-PVD) equipment is provided that includes a pair of differentially-pumped electron guns 32, a liquid-cooled crucible 34, a coating material ingot 36, and an ingot feed assembly 38. The crucible 34 holds the coating material ingot 36, which provides a target for the electron guns 32. Electron beams 32A are directed at the target defined by the ingot 36, which creates a melt pool 40 and a vapor cloud 42 of the coating material, such can be a thermal barrier coating (TBC) in one embodiment. Because those of ordinary skill in the art will understand the general features of EB-PVD equipment, further discussion here is unnecessary.

During coating, the support 18 and the work pieces 20 can be axially moved to a second position within the process chamber 12, shown in phantom and labeled with reference numbers carrying prime designations in FIG. 1. The work pieces 20' can be rotated within the vapor cloud 42 to deposit the coating material. Pre-heating and pre-oxidation facilitates coating growth on the work pieces 20', while allowing separately controlled environmental conditions (e.g., temperature and pressure) between the process chamber 12 and the pre-heating chamber 14 for better optimization of the different procedures performed in those different chambers.

Figure 2:
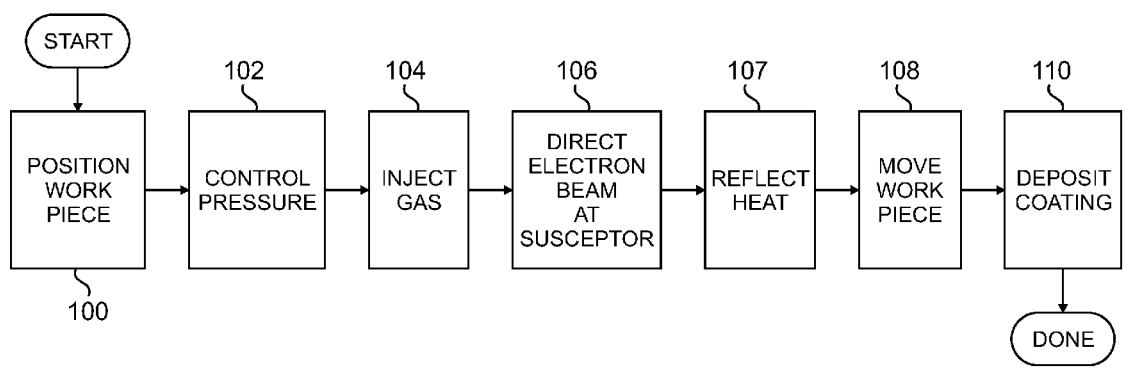
FIG. 2 is a flow chart illustrating a coating method according to the present invention.

FIG. 2 is a flow chart illustrating one embodiment of a coating method. A work piece (or multiple work pieces) are positioned within a housing of a pre-heating chamber, typically supported by a movable support member (step 100). Pressure within the pre-heating chamber housing is controlled (step 102). For example, the pressure within the pre-heating chamber during pre-heating and pre-oxidation process can be controlled to a vacuum in a range of approximately 0.01333 Pa (0.0001 Torr) to approximately 1.33 kPa (10 Torr), or alternatively a range of approximately 0.01333 Pa (0.0001 Torr) to approximately 0.533 Pa (0.004 Torr), or alternatively a range of approximately 66.66 Pa (0.5 Torr) to approximately 1.33 kPa (10 Torr). Oxygen, or another oxygen-containing gas, is injected into the pre-heating housing at or near the work piece to facilitate pre-oxidation (step 104). An electron beam from an electron gun is directed at a susceptor located adjacent to the work piece within the pre-heating housing (step 106). Heat within the pre-heating chamber, such as heat rising from the work piece, is reflected back toward the work piece with a reflector (step 107). The susceptor radiates heat toward the work piece to heat the work piece, which can occur in the presence of the supplied gas. When the susceptor is made of a ceramic material that is inert or non-reactive with respect to oxygen, the susceptor is relatively durable and will not degrade quickly like life-limited graphite components. After pre-heating and pre-oxidation is complete, the support member can move the work piece from the pre-heating housing to a process chamber (step 108). Once the work piece is positioned in the process chamber, a coating material (e.g., a stabilized zirconia TBC) is deposited on the pre-heated and pre-oxidized work piece (step 110). Coating deposition can be accomplished using known EB-PVD processes, or other known processes in further embodiments.

It will be understood that the present invention provides numerous advantages and benefits. For example, the present invention allows for pre-heating and pre-oxidation of work pieces coated using methods such as EB-PVD while maintaining a relatively long life cycle of the pre-heating and pre-oxidation equipment and reducing or eliminating a risk of undesirable transfer of carbon within a pre-heating chamber. Moreover, a thermal hood helps to enhance the pre-heating and pre-oxidation process by helping to thermally stabilize work pieces at desired temperatures.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims. For example, a thermal hood and/or susceptor can be omitted in some embodiments.

The invention claimed is:

1. An apparatus for coating a work piece, the apparatus comprising:
    a process chamber;
    a coating material supply apparatus located at least partially within the process chamber for delivering a coating material to the work piece;
    a pre-heater assembly adjoining the process chamber, the pre-heater assembly comprising:
        a housing that opens to the process chamber; and
        a thermal hood positioned within the housing and configured to reflect thermal energy for reflecting thermal energy toward the work piece; and
    a support for holding the work piece, wherein the support is movable to selectively move the work piece between a first position within the housing of the pre-heater assembly and a second position within the process chamber and outside the housing of the pre-heater assembly.

2. The apparatus of claim 1 and further comprising:
    a susceptor positioned at least partially within the housing, wherein the susceptor comprises a ceramic material; and
    a pre-heater electron gun configured to configured to direct an electron beam at the susceptor such that the susceptor radiates heat toward the work piece.

3. The apparatus of claim 2, wherein the susceptor comprises an inert oxide-based ceramic material.

4. The apparatus of claim 2, wherein the susceptor is positioned to one side of the work piece.

5. The apparatus of claim 1, wherein the coating material supply apparatus comprises an electron beam physical vapor deposition (EB-PVD) apparatus.

6. The apparatus of claim 5, wherein the EB-PVD apparatus comprises:

one or more coating deposition electron guns each configured to direct an electron beam at a coating material target to generate a vapor cloud of the coating material in the process chamber to coat the work piece when the support is in the second position.

7. The apparatus of claim 1, wherein the work piece comprises a gas turbine engine component.

8. The apparatus of claim 1, wherein the coating material comprises a thermal barrier coating for a gas turbine engine component.

9. The apparatus of claim 1, wherein the thermal hood provides reflective infrared shielding.

10. An apparatus for coating a work piece, the apparatus comprising:
 a process chamber;
 a coating material supply apparatus located at least partially within the process chamber for delivering a coating material to the work piece;
 a pre-heater assembly adjoining the process chamber, the pre-heater assembly comprising:
  a housing that opens to the process chamber;
  a thermal hood positioned within the housing and configured to reflect thermal energy;
  a susceptor positioned at least partially within the housing, wherein the susceptor comprises a ceramic material; and
  a pre-heater electron gun configured to configured to direct an electron beam at the susceptor such that the susceptor radiates heat toward the work piece; and
 a support for holding the work piece, wherein the support is movable to selectively move the work piece between a first position within the housings of the pre-heater assembly and a second position within the process chamber and outside the housing of the pre-heater assembly.

11. The apparatus of claim 10, wherein the susceptor comprises an inert oxide-based ceramic material.

12. The apparatus of claim 10, wherein the susceptor is positioned to one side of the work piece.

13. The apparatus of claim 10, wherein the susceptor comprises an inert oxide-based ceramic material.

14. The apparatus of claim 10, wherein the coating material supply apparatus comprises an electron beam physical vapor deposition (EB-PVD) apparatus.

15. The apparatus of claim 10, wherein the pre-heater apparatus is held in a vacuum in a range of approximately 0.533 Pa (0.004 Torr) to approximately 1.33 kPa (10 Torr).

* * * * *